(12) United States Patent
Nakamura et al.

(10) Patent No.: US 8,663,439 B2
(45) Date of Patent: *Mar. 4, 2014

(54) SPUTTERING TARGET FOR PRODUCING METALLIC GLASS MEMBRANE AND MANUFACTURING METHOD THEREOF

(75) Inventors: Atsushi Nakamura, Ibaraki (JP); Masataka Yahagi, Ibaraki (JP); Akihisa Inoue, Miyagi (JP); Hisamichi Kimura, Miyagi (JP); Shin-ichi Yamaura, Miyagi (JP)

(73) Assignees: JX Nippon Mining & Metals Corporation, Tokyo (JP); Tohoku University, Miyagi (JP)

( * ) Notice: Subject to any disclaimer, the term of this patent is extended or adjusted under 35 U.S.C. 154(b) by 1293 days.

This patent is subject to a terminal disclaimer.

(21) Appl. No.: 11/719,229

(22) PCT Filed: Nov. 4, 2005

(86) PCT No.: PCT/JP2005/020278
§ 371 (c)(1),
(2), (4) Date: May 15, 2007

(87) PCT Pub. No.: WO2006/051737
PCT Pub. Date: May 18, 2006

(65) Prior Publication Data
US 2009/0139858 A1   Jun. 4, 2009

(30) Foreign Application Priority Data
Nov. 15, 2004   (JP) .................................. 2004-330411

(51) Int. Cl.
| | | |
|---|---|---|
| C25B 9/00 | (2006.01) |
| C25B 13/00 | (2006.01) |
| C25B 11/00 | (2006.01) |
| C23C 14/00 | (2006.01) |
| H01B 1/06 | (2006.01) |
| H05B 7/085 | (2006.01) |
| C22C 1/04 | (2006.01) |
| C22C 1/06 | (2006.01) |
| C22C 33/02 | (2006.01) |

(52) U.S. Cl.
USPC .................. 204/298.13; 204/298.12; 252/507; 252/513; 252/514; 419/46

(58) Field of Classification Search
USPC ............... 204/298.13, 192.2, 192.26, 298.12; 419/46; 252/507, 513, 514
See application file for complete search history.

(56) References Cited

U.S. PATENT DOCUMENTS 4,824,481 A   4/1989   Chatterjee et al.
4,940,966 A   7/1990   Pettigrew et al.
(Continued)

FOREIGN PATENT DOCUMENTS

JP   62-070550 A   4/1987
JP   05-017868 A   1/1993
(Continued)

OTHER PUBLICATIONS

Machine Translation of JP2000265252.*
(Continued)

Primary Examiner — Michael Band
(74) Attorney, Agent, or Firm — Howson & Howson LLP

(57) ABSTRACT

A sputtering target for producing a metallic glass membrane characterized in comprising a structure obtained by sintering atomized powder having a composition of a ternary compound system or greater with at least one or more metal elements selected from Pd, Zr, Fe, Co, Cu and Ni as its main component (component of greatest atomic %), and being an average grain size of 50 µm or less. The prepared metallic glass membrane can be used as a substitute for conventional high-cost bulk metallic glass obtained by quenching of molten metal. This sputtering target for producing the metallic glass membrane is also free from problems such as defects in the metallic glass membrane and unevenness of composition, has a uniform structure, can be produced efficiently and at low cost, and does not generate many nodules or particles. Further provided is a method for manufacturing such a sputtering target for forming the metallic glass membrane.

2 Claims, 5 Drawing Sheets

(56) References Cited

U.S. PATENT DOCUMENTS

| | | | |
|---|---|---|---|
| 4,960,651 A | 10/1990 | Pettigrew et al. | |
| 4,992,095 A | 2/1991 | Nate et al. | |
| 5,518,530 A | 5/1996 | Sakai et al. | |
| 5,785,828 A | 7/1998 | Yamada et al. | |
| 5,882,493 A | 3/1999 | Iwasaki et al. | |
| 6,096,640 A | 8/2000 | Hu | |
| 6,127,016 A | 10/2000 | Yamada et al. | |
| 6,248,291 B1 * | 6/2001 | Nakagama et al. | 419/46 |
| 6,280,684 B1 | 8/2001 | Yamada et al. | |
| 6,503,592 B1 | 1/2003 | Yamada et al. | |
| 6,649,559 B2 | 11/2003 | Drost et al. | |
| 6,761,755 B2 | 7/2004 | Jantsch et al. | |
| 7,789,948 B2 | 9/2010 | Nakamura et al. | |
| 2002/0106297 A1 | 8/2002 | Ueno et al. | |
| 2003/0008168 A1 | 1/2003 | Shibuya et al. | |
| 2003/0126804 A1 | 7/2003 | Rosenflanz et al. | |
| 2004/0256035 A1 | 12/2004 | Yamakoshi et al. | |
| 2006/0037680 A1 | 2/2006 | Yamakoshi | |
| 2006/0081310 A1 * | 4/2006 | Yokoyama | 148/403 |
| 2006/0137782 A1 | 6/2006 | Yamakoshi et al. | |
| 2006/0185771 A1 | 8/2006 | Inoue et al. | |
| 2009/0064861 A1 | 3/2009 | Nakamura et al. | |
| 2010/0320085 A1 | 12/2010 | Nakamura et al. | |

FOREIGN PATENT DOCUMENTS

| | | | |
|---|---|---|---|
| JP | 05017868 A | * | 1/1993 |
| JP | 05247642 A | * | 9/1993 |
| JP | 2000-144380 A | | 5/2000 |
| JP | 2000-207725 A | | 7/2000 |
| JP | 2000265252 A | * | 9/2000 |
| JP | 2001-295035 A | | 10/2001 |
| JP | 2002-069550 A | | 3/2002 |
| JP | 2002-212716 A | | 7/2002 |
| JP | 2002-363615 A | | 12/2002 |
| JP | 2003-003222 A | | 1/2003 |
| JP | 2003-201560 A | | 7/2003 |
| JP | 2004-042017 A | | 2/2004 |
| WO | 2004/044260 A1 | | 5/2004 |
| WO | 2005/012591 A1 | | 2/2005 |

OTHER PUBLICATIONS

Fan et al., "Deformation Behavior of Zr-Based Bulk Nanocrystalline Amorphous Alloys", Physical Review B, vol. 61, No. 6, pp. R3761-R3763, Feb. 1, 2000.

Kakiuchi et al., "Application of Zr-Based Bulk Glassy Alloys to Golf Clubs", Materials Transactions, vol. 4, No. 4, pp. 678-681, Mar. 15, 2001.

Mathaudhu et al., "Progress in Consolidation of Amorphous Zr-Based Powder into Bulk Metallic Glass", Material Society Research Symposium Proceedings, vol. 754, pp. CC3.5.1-CC3.5.8, 2003 (month unknown).

Gu et al., "Structure of Shear Bands in Zirconium-Based Metallic Glasses Observed by Transmission Electron Microscope", Material Society Research Symposium Proceedings, vol. 754, pp. CC7.9.1-CC7.9.6, 2003 (month unknown).

One page English Language Abstract of JP 2000-265252 A, Sep. 26, 2000.

One page English Language Abstract of JP 2000-159503, Jun. 13, 2000.

One page English Language Abstract of JP 2004-162109, Jun. 10, 2004.

M. Yamasaki et al., "Thermal Diffusivity and Conductivity of $Zr_{55}AL_{10}Ni_5Cu_{30}$ Bulk Metallic Glass", Scripta Materialia, vol. 53, pp. 63-67, Apr. 8, 2005.

The Mechanical Social Systems Foundation, "Report of Research Study on Practical Application and Commercialization of Metallic Glass", Systems Engineering Development and Research, pp. 21-23, Mar. 2009.

* cited by examiner

SPUTTERING TARGET FOR PRODUCING METALLIC GLASS MEMBRANE AND MANUFACTURING METHOD THEREOF

TECHNICAL FIELD

The present invention relates to a sputtering target for producing a metallic glass membrane that generates few nodules or particles, and to its manufacturing method.

BACKGROUND ART

An amorphous metallic glass thin membrane can be used as a hydrogen separation membrane or a magnetic film. Nevertheless, metallic glass is a multicomponent system of a ternary compound system or greater, and there are problems with a conventional manufacturing method of a target in that segregation will occur during melting or casting, or crystallites will grow during solidification.

Such segregation and grown crystallites will cause the generation of nodules and particles, and there is a problem in that the sputtered membrane would be defective. Further, adverse effects are also inflicted on the sputtering characteristics.

In recent years, there is increasing demand for efficiently separating hydrogen in fuel cells and other items. Generally speaking, since hydrogen produced from fossil fuel or water contains various impurities due to its manufacturing method, it is necessary to perform purification upon separating such impurities in order to obtain high purity hydrogen.

As the purification method, the PSA (Pressure Swing Adsorption) method, membrane separation process, cryogenic distillation method, absorption method and the like may be used. Among the above, the membrane separation process employing a metallic membrane is the only process that is able to manufacture ultrahigh purity hydrogen, which can be put into practical application, at a high yield and with sufficient speed.

As the hydrogen separation membrane, numerous materials that do and do not contain Pd (since Pd is costly) have been proposed in the past (refer to Non-Patent Document 1). In particular, there is indication that a Ni—Nb—Zr metallic glass alloy is effective (refer to Non-Patent Documents 2 and 3). Although the ultrafine processing technique, in particular the deposition technique, is primarily used for forming a hydrogen gas separation membrane, since even the crystal grain boundary of the formed film will become a problem in ultrafine processing, demanded is a deposition method capable of forming a film without a crystal grain boundary; that is, an amorphous membrane or an equivalent film, upon forming a thin membrane.

Meanwhile, as methods of manufacturing bulk metallic glass, proposed are a water quenching method of obtaining virgulate metallic glass by quenching the molten metal enclosed in a silica tube, a method of performing arc melting and quenching with a water-cooled copper mould, a clamping casting method of obtaining metallic glass by melting metal on a copper mold and thereafter pressing this with a cope and quenching the product, a method of performing injection molding at high pressure and quenching this in a copper mold, and a method of manufacturing a metallic glass wire rod by solidifying molten metal on a rotating disk (for instance, refer to Non-Patent Document 4).

Nevertheless, since each of these manufacturing methods is a manufacturing method from molten metal and is subject to quenching, it is necessary to devise the apparatus to meet the quenching conditions, and there is a drawback in that the cost would be extremely high. Further, even when forming a thin membrane, there are limitations, and there is a problem in that it was only possible to form a thin membrane of up to 30 µm in the past.

[Non-Patent Document 1] "Developmental Status of PEFC Electrode, Separator and Hydrogen Separation Membrane Employing Metallic Glass", Written by Naotsugu Meguro, Fuel Cells, Vol. 2, No. 2, 2003, Pages 13 to 17

[Non-Patent Document 2] "Hydrogen Permeation Characteristics of Ni—Nb—Zr Metallic Glass Alloy", Written by Shinichi Yamaura (and 5 others) (680) The Japan Institute of Metals, Spring Convention Lecture Summary (2003), Page 346

[Non-Patent Document 3] Shinichi Yamaura (and 6 others) "Hydrogen Permeation Characteristics of Melt-Spun Ni—Nb—Zr Amorphous Alloy Membranes" Materials Transactions, Vol. 44, No. 9 (2003) pp. 1885-1890

[Non-Patent Document 4] Functional Material "Manufacturing Method of Bulk Metallic Glass", June 2002 Edition, Vol. 22, No. 6, Pages 26 to 31

DISCLOSURE OF THE INVENTION

In light of the above, an object of the present invention is to provide a sputtering target for producing a metallic glass membrane which can be used as a substitute for conventional high-cost bulk metallic glass obtained by quenching of molten metal, is free from problems such as defects in the metallic glass membrane and unevenness of composition, has a uniform structure, can be manufactured at low cost, and does not generate many nodules or particles. Another object of the present invention is to provide the manufacturing method of such a sputtering target for producing a metallic glass membrane.

In order to achieve the foregoing objects, the present invention provides:

1. A sputtering target for producing a metallic glass membrane characterized in comprising a structure obtained by sintering atomized powder having a composition of a ternary compound system or greater with at least one or more metal elements selected from Pd, Zr, Fe, Co, Cu and Ni as its main component (component of greatest atomic %), and being an average grain size of 50 µm or less;
2. The sputtering target according to paragraph 1 above, wherein the crystallite size sought from XRD (X-ray diffraction) is 10Å to 200Å;
3. The sputtering target according to paragraph 1 or paragraph 2 above, wherein a segregated crystal of 1 µm or larger does not exist;
4. A manufacturing method of a sputtering target for producing a metallic glass membrane including the step of sintering atomized powder having a composition of a ternary compound system or greater with at least one or more metal elements selected from Pd, Zr, Fe, Co, Cu and Ni as its main component (component of greatest atomic %), and being an average grain size of 50 µm or less;
5. The manufacturing method of a sputtering target according to paragraph 4 above, wherein the crystallite size sought from XRD (X-ray diffraction) is 10Å to 200Å; and
6. The manufacturing method of a sputtering target according to paragraph 4 or paragraph 5 above, wherein the average grain size of the atomized powder is 50 µm or less.

The sputtering target for producing a metallic glass membrane and its manufacturing method according to the present invention yield a superior effect in that the it is possible to obtain a target with high density and a uniform structure according to the sintering method, and, when sputtering is performed using this target, the target surface after sputtering will become a smooth eroded surface, evenness (uniformity) of the film will be favorable, and there is hardly any generation of arcing or particles.

Further, the present invention yields significant effects in that it is possible to make the thickness of the thin membrane much thinner than the bulk body obtained from a conventional molten metal quenching method, the size of the thin membrane can be enlarged without limitation, and the thin membrane can be manufactured at low cost.

BEST MODE FOR CARRYING OUT THE INVENTION

Figure 1:
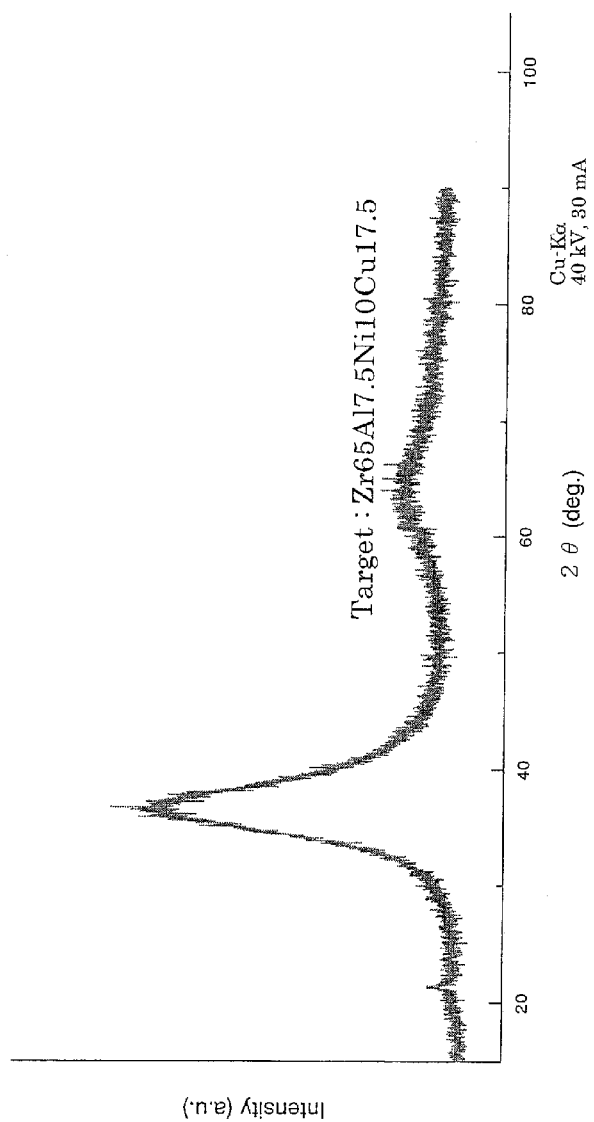
FIG. 1 is a diagram showing the XRD (X-ray diffraction) profile of the target of Example 1.

The sputtering target for producing a metallic glass membrane of the present invention comprises a composition of a ternary compound system or greater with at least one or more metal elements selected from Pd, Zr, Fe, Co, Cu and Ni as its main component (component of greatest atomic %).

With this metallic glass composition, at least one or more metal elements selected from Pd, Zr, Fe, Co, Cu and Ni are used as its main component (component of greatest atomic %). When other elements are used as the main component, the amorphous stability of the amorphous membrane obtained by sputtering will be inferior, and crystallization will occur easily. When crystallization occurs easily, the mechanical strength and heat characteristics will deteriorate.

In order to make this membrane function as a metallic glass membrane such as a hydrogen separation membrane, it is desirable that the film thickness is 10 μm or less. This is because if the film thickness exceeds 10 μm, the function as a metallic glass membrane such as a hydrogen separation membrane will deteriorate.

Even from the perspective that the limit of thinning the thin membrane obtained with the molten metal quenching method is 30 μm, it is evident that the present invention is dramatically superior.

A significant characteristic of the sputtering target for producing a metallic glass membrane of the present invention is that it comprises a structure obtained by sintering atomized powder having an average grain size of 50 μm or less.

Obtained is an amorphous membrane that does not show a peak in XRD (X-ray diffraction) even though it is a membrane obtained by sputtering a sintered target as described later.

Generally speaking, the sputtering method is an effective method as a deposition method since the composition, structure, property and so on of the target are directly reflected on the characteristics of the thin membrane. This composition is reflected on the sputtered membrane obtained by sputtering the target of the present invention, and it is thereby possible to form a favorable metallic glass membrane.

With this target, it is possible to make the crystallite size sought from XRD (X-ray diffraction) to be 10 to 200Å. Moreover, this target is characterized in that a segregated crystal of 1 μm or larger does not exist. If the crystal grain size of the target itself is small, the surface roughness subject to sputtering erosion will become smooth, and this will yield an effect of inhibiting the generation of particles that aggravate the yield of products.

In particular, an amorphous state is the ultimate structural form for reducing particles. Further, the amorphization and ultra-refinement of the structure will improve the uniformity of the target structure and composition, and products employing this are characterized in that they will not encounter problems such as the non-uniformity of composition and the like.

The sputtering target for producing a metallic glass membrane of the present invention can be manufactured by sintering gas atomized powder having a composition of a ternary compound system or greater with at least one or more metal elements selected from Pd, Zr, Fe, Co, Cu and Ni as its main component (component of greatest atomic %) as described above.

In particular, by using atomized powder having an average grain size of 50 μm or less, it is possible to reduce the crystallite size of the target, and inhibit the segregation of the target.

The raw material of the foregoing component, for instance, is melted (alloyed) via sealed ampoule melting, arc melting, or high frequency melting, the obtained alloy is re-melted, and, in certain cases, the foregoing raw material melting process is used as is to prepare alloy powder based on an atomization technique such as gas atomization, water atomization, or oil atomization.

Upon manufacturing gas atomized powder, for instance, argon gas is used as the injection gas and injected from a 0.8 mmφ quartz nozzle. The atomized gas pressure, for example, is 80 kgf/cm$^2$, and the molten metal gas pressure is 0.3 kgf/cm$^2$ upon manufacturing this gas atomized powder.

As the sintering (Spark Plasma Sintering: SPS) conditions, pressure of 600 MPa, and a temperature that is of a crystallization temperature or less are adopted (conditions are changed according to the composition). The foregoing gas atomization and sintering conditions may be arbitrarily changed according to the material, and are not limited to the foregoing conditions.

When setting the sintering conditions, this is basically conducted between the crystallization temperature and glass transition point temperature, and it is desirable to perform sintering near the glass transition point if the sintering density rises to a level that will not cause any practical problems (for instance, a relative density of 90% or higher). Further, it is desirable to keep the heating time during sintering as short as possible in order to maintain the glass state.

This alloy powder is subject to hot pressing or spark plasma sintering (SPS) in order to manufacture a target. With the sputtering target for producing a metallic glass membrane of the present invention obtained by sintering, it is possible to make the crystallite size sought from XRD (X-ray diffraction) 1 nm to 20 nm.

The manufactured sintered body is processed into a prescribed shape (surface processing such as machining and polishing) in order to obtain a target. The obtained sputtering target of the present invention had an ultra-fine nano-size uniform structure.

When sputtering is performed using this kind of a target, significant effects are yielded such as being able to realize favorable membrane evenness (uniformity), inhibit the generation of arcing and particles, and even improve the quality of sputtering deposition.

The sputtering target of the present invention does not have to be limited to the deposition of an ultrafine processing technique, and may be used in an amorphous thin membrane or a crystalline thin membrane as a matter of course.

EXAMPLES

Examples of the present invention are now explained. Incidentally, these examples are merely illustrative, and the present invention shall in no way be limited thereby. In other words, the present invention shall include the various modes and modifications covered by the technical spirit of this invention.

Examples 1-8

A composition of a ternary compound system or greater with at least one or more metal elements selected from Pd, Zr, Fe, Co, Cu and Ni as its main component (component of greatest atomic %) was mixed in a specified quantity as shown in Table 1 and melted in order to prepare a mother alloy. Subsequently, this alloy was melted, and the molten metal was sprayed from a 0.8 mmϕ quartz nozzle by using argon gas as the injection gas to manufacture atomized powder.

Here, the atomized gas pressure was 80 kgf/cm$^2$, and the molten metal gas pressure was 0.3 kgf/cm$^2$. Thereby, atomized powder having a median size of D50 (34 to 45 μm) shown in Table 1 was obtained.

Subsequently, the atomized powder was filled in a graphite die, and subject to hot pressing and densified under the conditions of an Ar atmosphere, surface pressure of 300 kg/cm$^2$, temperature of 520° C., and retention time of 1 hour. The obtained sintered body had a relative density of 95% or higher, and a high density sintered body was obtained.

The sintered body was processed into a 6-inch, 6 mmϕ target. The XRD (X-ray diffraction) profile of the obtained target is shown in FIG. 1 (only Example 1 is shown). The other Examples attained the same result (omitted).

Based on the profile of each Example, the average crystallite size was calculated from Scherrer's formula. The average crystallite size was 10 to 120 Å (1 to 12 nm) as shown in Table 1, respectively.

Figure 2:
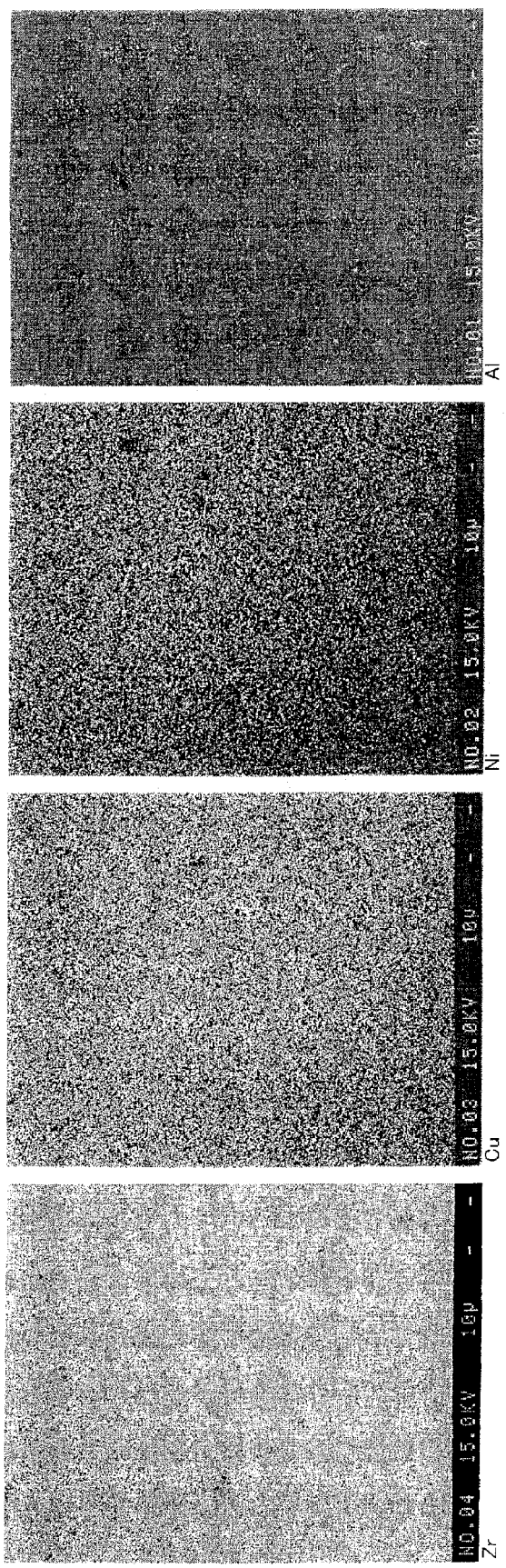
FIG. 2 is a diagram showing the segregation state of the respective elements based on EPMA of the target of Example 1.

Further, evaluation of the segregation state of the respective elements based on EPMA regarding Example 1 is shown in FIG. 2. It is evident that segregation cannot be acknowledged from FIG. 2, and the dispersion is uniform. No segregation could be acknowledged in the other Examples as well, and it was confirmed that the respective elements were distributed uniformly (not shown).

Figure 3:
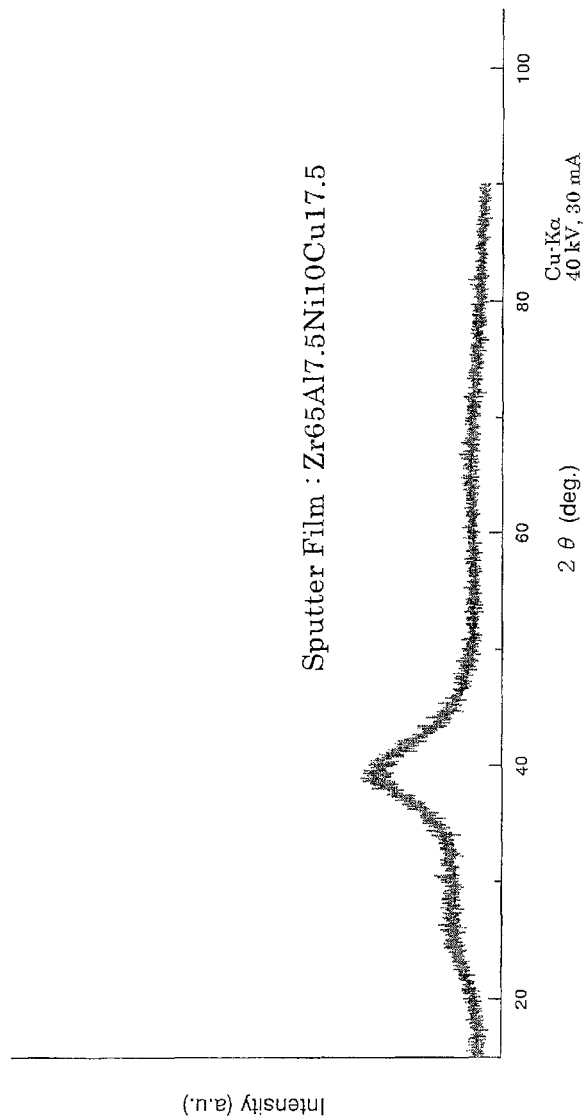
FIG. 3 is a diagram showing the XRD measurement result of the membrane when sputtering is performing with the target of Example 1.

Subsequently, using the target of Example 1, DC sputtering was performed under the conditions of pure Ar, 0.5 Pa and 300 W in order to form a metallic glass membrane. The film thickness after deposition was 1 μm. The XRD measurement result of the sputtered membrane is shown in FIG. 3.

The film evenness (uniformity) was favorable, and the generation of arcing and particles could hardly be acknowledged. Further, nodules could not be observed in the target after sputtering, and a smooth eroded surface was obtained. The surface roughness Ra of the target after sputtering was 0.25 μm.

As with Example 1, the other Examples also showed favorable film evenness (uniformity), and the generation of arcing and particles could hardly be acknowledged. Further, nodules could not be observed in the target after sputtering, and a smooth eroded surface was obtained. The surface roughness of the target after sputtering was 0.12 to 0.34 μm. The results are collectively shown in Table 1.

Comparative Examples 1-12

The materials of the composition shown in Comparative Examples 1-12 were mixed in a specified quantity as shown in Table 1 and Ar-melted and casted in order to prepare an ingot having a relative density 88.4 to 99.8%.

This ingot was processed into a 3-inch, 6 mmϕ target. The average crystallite size calculated from Scherrer's formula regarding the obtained target was 140 to 850 Å (14 to 85 nm) as shown in Table 1, respectively.

Figure 4:
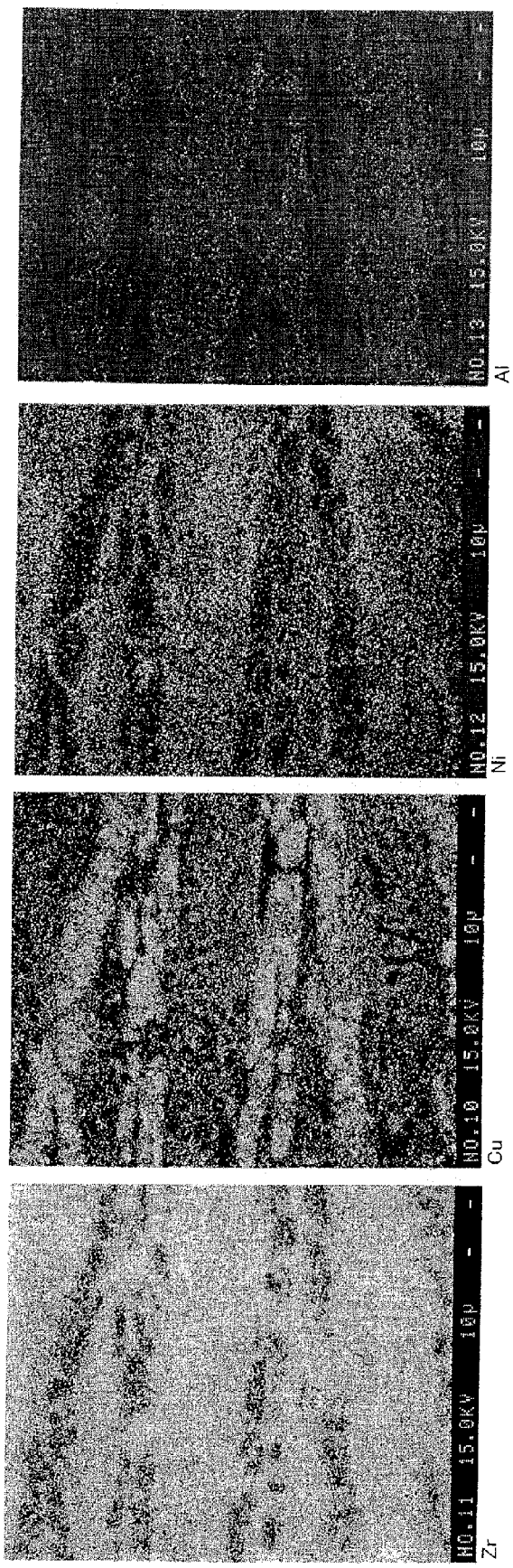
FIG. 4 is a diagram showing the segregation state of the respective elements based on EPMA of the target of Comparative Example 1.

Further, evaluation of the segregation state of Comparative Example 1 based on EPMA is shown in FIG. 4. In other words, segregation was severe in the constituent elements contained in the Comparative Examples, and the obtained target lacked uniformity. The other Comparative Examples attained the same results (not shown).

Figure 5:
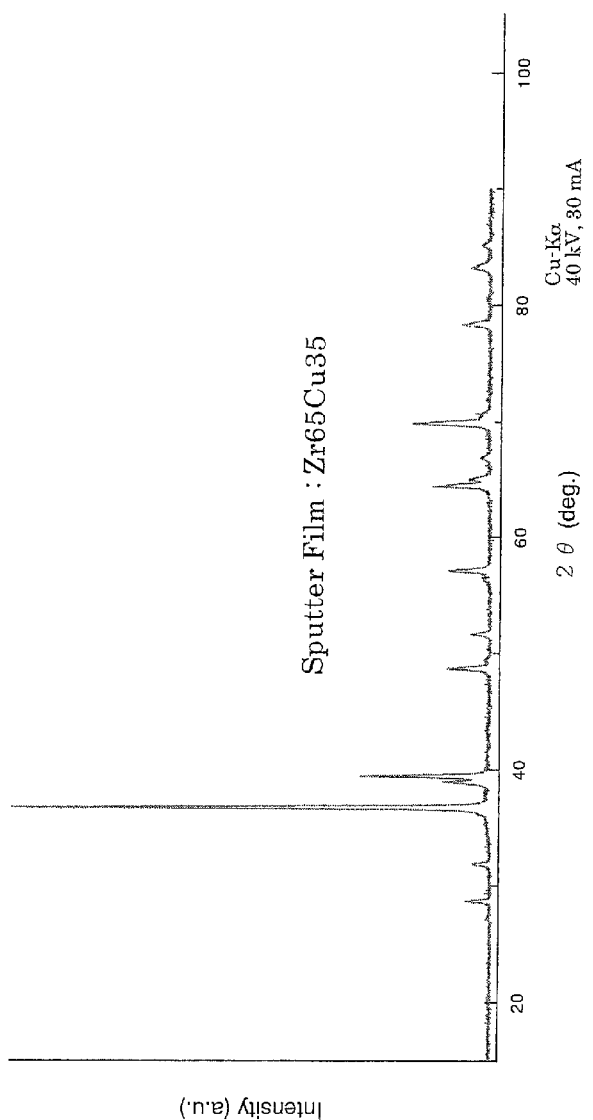
FIG. 5 is a diagram showing the XRD measurement result of the membrane when sputtering is performing with the target of Comparative Example 4.

Subsequently, using this target, DC sputtering was performed under the conditions of pure Ar, 0.5 Pa and 300 W in order to form a membrane. The film thickness after deposition was 1.1 μm. The sputtered membrane was subject to XRD measurement. A crystalline film was formed in each of the cases of Comparative Examples 4, 5, 6, 7 and 8. The results of Comparative Example 4 are representatively shown in FIG. 5.

Although an amorphous membrane was formed in Comparative Examples 1-3 and Comparative Examples 9-12, the surface roughness after sputtering was coarse at 0.87 to 3.52 μm, and the average crystallite size was also large in comparison to the Examples at 140 to 800 Å.

In each of the foregoing cases, blackish nodules were observed in the target after sputtering. Further, defects deemed to be the cause of nodules were observed in the membrane.

|  | Composition | Atomized Powder D50 μm | Relative Density % | Average Crystallite Size Å | Surface Roughness of Target after Sputtering μm | Crystal Condition of Sputtered Membrane |
|---|---|---|---|---|---|---|
| Example 1 | Zr65Al7.5Ni10Cu17.5 | 39 | 98.2 | 14 | 0.25 | Amorphous |
| Example 2 | Pd78Cu6Si16 | 45 | 97 | 10 | 0.12 | Amorphous |
| Example 3 | Cu60Zr30Ti10 | 34 | 98.3 | 12 | 0.34 | Amorphous |
| Example 4 | Co72.5Al12.5B15 | 40 | 96.4 | 18 | 0.2 | Amorphous |
| Example 5 | Fe70Zr10B20 | 36 | 98.8 | 20 | 0.18 | Amorphous |
| Example 6 | Pd50Cu15Si35 | 42 | 97.4 | 17 | 0.12 | Amorphous |

-continued

|  | Composition | Atomized Powder D50 μm | Relative Density % | Average Crystallite Size Å | Surface Roughness of Target after Sputtering μm | Crystal Condition of Sputtered Membrane |
|---|---|---|---|---|---|---|
| Example 7 | Ni35Nb35Zr30 | 39 | 95.5 | 120 | 0.24 | Amorphous |
| Example 8 | Ni35Ta35Zr30 | 40 | 96.8 | 110 | 0.26 | Amorphous |
| Comparative Example 1 | Zr65Al7.5Ni10Cu17.5 | — | 99.8 | 350 | 0.87 | Amorphous |
| Comparative Example 2 | Zr65Al7.5Ni10Cu17.5 | 39 | 98.2 | 800 | 1.42 | Amorphous |
| Comparative Example 3 | Zr65Al7.5Ni10Cu17.6 | 103 | 98.4 | 320 | 3.52 | Amorphous |
| Comparative Example 4 | Zr65Cu35 | 45 | 95.5 | 350 | 1.1 | Crystalline |
| Comparative Example 5 | Pd78Si22 | 43 | 96.2 | 850 | 2.51 | Crystalline |
| Comparative Example 6 | Cu60Ti40 | 58 | 95.1 | 140 | 3.42 | Crystalline |
| Comparative Example 7 | Co72.5Al27.5 | 44 | 97.5 | 260 | 1.23 | Crystalline |
| Comparative Example 8 | Fe70Zr30 | 36 | 93.2 | 230 | 2.19 | Crystalline |
| Comparative Example 9 | Pd78Cu6Si16 | 110 | 97.5 | 350 | 2.51 | Amorphous |
| Comparative Example 10 | Cu60Zr30Ti10 | 182 | 96.4 | 420 | 3.42 | Amorphous |
| Comparative Example 11 | Co72.5Al12.5B15 | 125 | 98.8 | 280 | 1.23 | Amorphous |
| Comparative Example 12 | Fe70Zr10B20 | 138 | 97.9 | 260 | 2.19 | Amorphous |

INDUSTRIAL APPLICABILITY

The sputtering target for producing a metallic glass membrane according to the present invention yields a superior effect in that the obtained target has high density and a uniform structure according to the sintering method, and, when sputtering is performed using this target, the target surface after sputtering will become a smooth eroded surface, evenness (uniformity) of the film will be favorable, and there is hardly any generation of arcing or particles.

Further, the present invention yields significant effects in that it is possible to make the thickness of the thin membrane much thinner than the bulk body obtained from a conventional molten metal quenching method, the size of the thin membrane can be enlarged without limitation, and the thin membrane can be manufactured at low cost. The sputtered membrane obtained thereby is extremely useful in producing metallic glass.

The invention claimed is:

1. A sputtering target, comprising a sintered body sputtering target having an ultrafine nano-size uniform structure of a glass state, said sputtering target being made of an alloy composition selected from the group consisting of $Ni_{35}Nb_{35}Zr_{30}$ and $Ni_{35}Ta_{35}Zr_{30}$, and said sputtering target having an average crystallite size determined by XRD (X-ray diffraction) peak profile by using Scherrer's equation of 10 Å to 200 Å.

2. A sputtering target according to claim 1, wherein a grain having an element segregation of 1 μm or larger does not exist within said sputtering target.

* * * * *